(12) United States Patent
Rohr et al.

(10) Patent No.: US 9,933,460 B2
(45) Date of Patent: Apr. 3, 2018

(54) TERMINAL BLOCK HAVING INTEGRATED CURRENT TRANSFORMERS

(71) Applicant: SCHNEIDER ELECTRIC IT CORPORATION, West Kingston, RI (US)

(72) Inventors: Daniel J. Rohr, Wildwood, MO (US); Richard J. Zeh, O'Fallon, MO (US); Timothy Stache, High Ridge, MO (US)

(73) Assignee: SCHNEIDER ELECTRIC IT CORPORATION, West Kingston, RI (US)

( * ) Notice: Subject to any disclaimer, the term of this patent is extended or adjusted under 35 U.S.C. 154(b) by 392 days.

(21) Appl. No.: 14/652,594

(22) PCT Filed: Dec. 20, 2012

(86) PCT No.: PCT/US2012/070939
§ 371 (c)(1),
(2) Date: Jun. 16, 2015

(87) PCT Pub. No.: WO2014/098866
PCT Pub. Date: Jun. 26, 2014

(65) Prior Publication Data
US 2015/0338443 A1  Nov. 26, 2015

(51) Int. Cl.
*H01R 31/00* (2006.01)
*G01R 15/18* (2006.01)
*G01R 19/00* (2006.01)
*H01R 9/24* (2006.01)
*H01R 13/66* (2006.01)
*H01R 25/00* (2006.01)

(52) U.S. Cl.
CPC ......... *G01R 15/18* (2013.01); *G01R 19/0092* (2013.01); *H01R 9/24* (2013.01); *H01R 9/2425* (2013.01); *H01R 13/6683* (2013.01); *H01R 25/003* (2013.01)

(58) Field of Classification Search
CPC ................ H01R 9/2425; H01R 13/447; H01R 13/6683; G01R 19/0092
See application file for complete search history.

(56) References Cited

U.S. PATENT DOCUMENTS

| | | | | |
|---|---|---|---|---|
| 5,792,986 A | * | 8/1998 | Lee ........................ | H01R 31/06 174/68.1 |
| 6,497,592 B1 | * | 12/2002 | Beadle ................. | H01R 9/2425 439/718 |
| 9,184,546 B2 | * | 11/2015 | Fleisig ................. | H01R 25/003 |
| 2003/0220006 A1 | * | 11/2003 | Gentry ............... | H01R 13/7032 439/188 |

(Continued)

OTHER PUBLICATIONS

International Search Report from corresponding PCT/US2012/070939 dated Mar. 8, 2013.

*Primary Examiner* — Alesa Allgood
(74) *Attorney, Agent, or Firm* — Lando & Anastasi, LLP (57) ABSTRACT

A terminal block for a power device includes a casing and a power cord. The terminal block is configured to be secured within the casing and to secure the power cord. The terminal block includes a body configured to fit within the casing of the power device. The body has at least one recess formed therein. The terminal block further includes at least one current transformer sized to fit within the at least one recess of the body.

18 Claims, 9 Drawing Sheets

(56) References Cited

U.S. PATENT DOCUMENTS

2006/0146581 A1\* 7/2006 Murphy ................ H02B 1/34
　　　　　　　　　　　　　　　　　　　363/37
2012/0200154 A1\* 8/2012 Cravens ................ G06F 1/189
　　　　　　　　　　　　　　　　　　　307/18

\* cited by examiner

TERMINAL BLOCK HAVING INTEGRATED CURRENT TRANSFORMERS

This application is a U.S. National Stage Application under 35 U.S.C. § 371 from International Application No. PCT/US2012/070939, filed Dec. 20, 2012, which is hereby incorporated by reference in its entirety for all purposes.

BACKGROUND OF THE DISCLOSURE

1. Field of the Disclosure

Embodiments of the present disclosure are directed to power systems, and more particularly to a power system having a terminal block configured to secure three-phase wiring with integrated current transformers.

2. Discussion of Related Art

Figure 1:
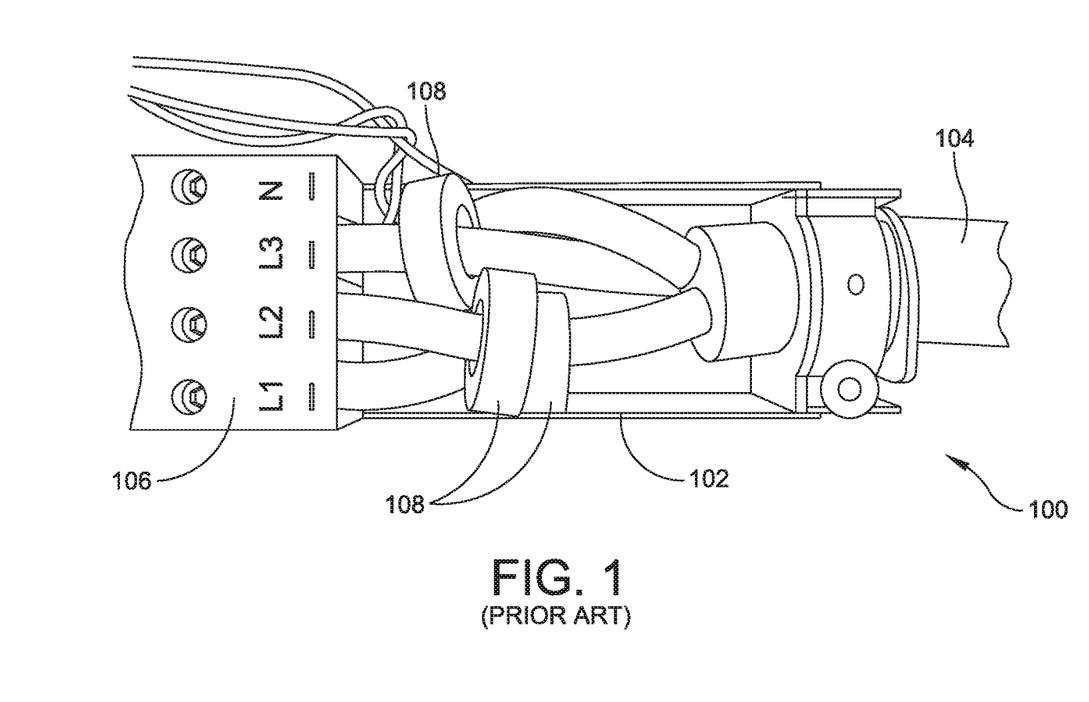
FIG. 1 is a perspective view of a power device having a prior art terminal block and current transformer system of one embodiment.
Figure 2:
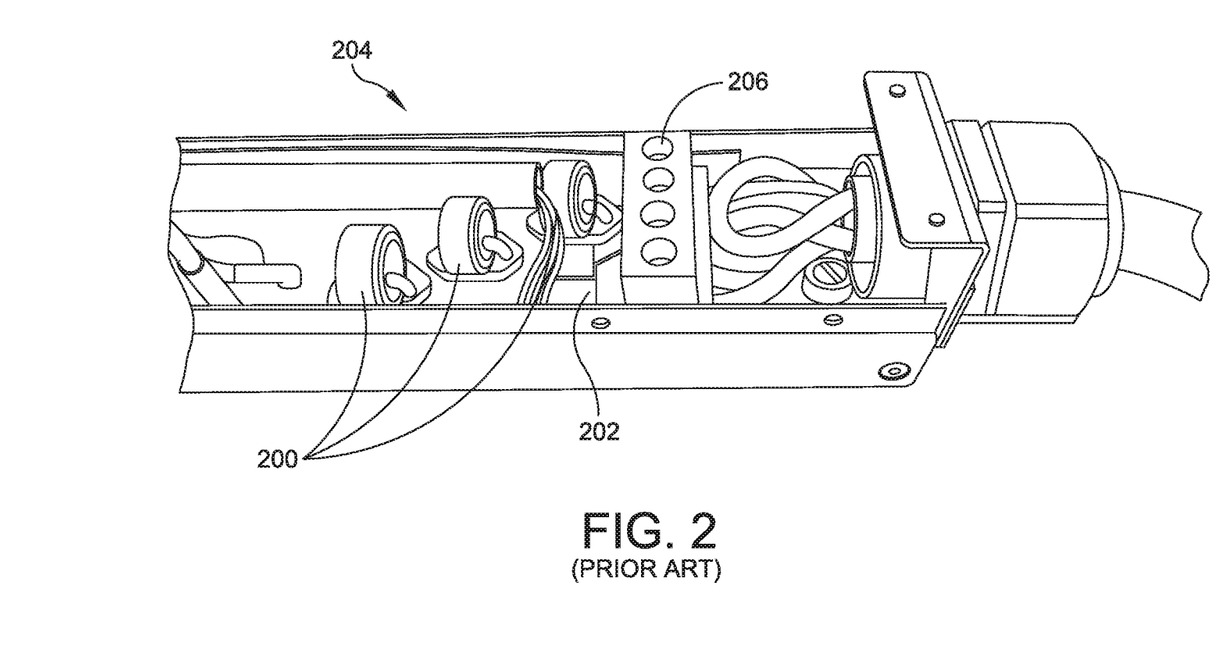
FIG. 2 is a perspective view of a power device having a prior art terminal block and current transformer system of another embodiment.

FIG. 1 illustrates a prior art power device 100, such as a rack powered distribution unit or a power strip, having a chassis or case 102 that houses components of the device and a power cord 104 that connects to the chassis at one end of the chassis. In one example, a standard terminal block 106 that is secured within the power device 100 is configured to secure the power cord 104, which may embody a 5-wire, 6AWG power cord (three-phase wires, one ground wire, and one neutral wire). One or more current transformers, each indicated at 108, may be provided to measure current through the wires of the power cord 104 within the power device 100. As shown in FIG. 1, the current transformers 108 "float" on the wires of the power cord 104 between the chassis 102 and the terminal block 106. In another example illustrated in FIG. 2, the current transformers 200 may be integrated on a circuit board 202 of a power device 204 between a terminal block 206 and loads within the device. The terminal block 106 may be purchased from Weidmuller Interface International Trading (Shanghai) Co., Ltd. of Shanghai, China under manufacture identification number QSUN-6MPH9P.

Within equipment racks, rack powered distribution units are becoming more powerful and denser. Such devices are very congested with thick and unbendable wires that enter the device. As a result, the routing of the power cord within the end of the device and through the current transformers and terminal blocks is becoming increasingly difficult and laborious. It can be a challenge to assemble the device and/or fit all of the required components of the device within the chassis of the device.

SUMMARY OF THE DISCLOSURE

The present disclosure is directed to a terminal block that integrates the current transformers within the terminal block.

One aspect of the disclosure is directed to a terminal block for a power device including a casing and a power cord. The terminal block is configured to be secured within the casing and to secure the power cord. In one embodiment, the terminal block comprises a body configured to fit within the casing of the power device. The body has at least one recess formed therein. The terminal block further comprises at least one current transformer sized to fit within the at least one recess of the body.

Embodiments of the terminal block further include up to three current transformers sized to fit within respective recesses of the body. In one example, the terminal block may be configured to secure a 5-wire, 3-phase, 6AWG power cord. However, many power configurations and wire gauges may be used. Each recess may be circular in shape. The body may be rectangular in cross section. In a certain embodiment, the power device is a rack powered distribution unit. The body may include a front portion and a back portion, with the front portion and the back portion each being fabricated from dielectric material. The front portion of the body may include a front surface having three recesses formed therein. The portion of the body may include three lugs corresponding to the three recesses formed in the front portion of the body. Each lug may be configured to secure an end of a wire of the power cord through a respective current transformer. Each lug may include a housing, a set screw coupled to the housing and configured to secure a wire to the housing, a folded long tab coupled to the housing, and a folded short tab coupled to the housing. The front portion may include a back surface that includes three pockets formed therein, with each pocket being configured to receive a respective lug therein. The back portion may include at least one of a fourth lug and a fifth lug configured to receive a finger that is part of a mounting plate that secures the terminal block to the casing of the power device. The fourth lug may include a housing, a set screw coupled to the housing and configured to secure a wire to the finger.

Another aspect of the disclosure is directed to a method of measuring current within a power device. In one embodiment, the method comprises: providing a terminal block configured to be secured within a casing of the power device and to secure a power cord of the power device; inserting at least one current transformer sized to fit within at least one recess provided in a body of the terminal block; connecting at least one wire of a power cord to a lug of the terminal block with the at least one wire extending through the at least one current transformer; and measuring current of the at least one wire of the power cord with the at least one current transformer.

Embodiments of the method are further disclosed. In one example, a front portion of the body of the terminal block may include a front surface having three recesses formed therein. A back portion of the body of the terminal block may include three lugs corresponding to the three recesses formed in the front portion of the body. The method further may include inserting three current transformers into respective recesses of the body. Each lug may be configured to secure an end of a wire of the power cord. Each lug may further include a housing, a set screw coupled to the housing and configured to secure a wire to the housing, a folded long tab coupled to the housing, and a folded short tab coupled to the housing. The back portion may include a fourth or neutral lug configured to receive a finger that is part of a mounting plate that secures the terminal block to the casing of the power device. The fourth lug may include a housing, a set screw coupled to the housing and configured to secure a wire to the finger.

BRIEF DESCRIPTION OF THE DRAWINGS

For a better understanding of the present disclosure, reference is made to the drawing figures which are incorporated herein by reference and in which.

DETAILED DESCRIPTION OF THE DISCLOSURE

For the purposes of illustration only, and not to limit the generality, the present disclosure will now be described in detail with reference to the accompanying figures. This disclosure is not limited in its application to the details of construction and the arrangement of components set forth in the following description or illustrated in the drawings. The disclosure is capable of other embodiments and of being practiced or being carried out in various ways. Also the phraseology and terminology used herein is for the purpose of description and should not be regarded as limiting. The use of "including," "comprising," "having," "containing," "involving," and variations thereof herein, is meant to encompass the items listed thereafter and equivalents thereof as well as additional items.

Embodiments of the disclosure provide a power device having a terminal block that is configured to integrate current transformers within the terminal block. In one embodiment, the terminal block includes three recesses formed therein, with each recess being configured to receive a current transformer. The terminal block with integrated current transformers are configured to measure current flowing through lines of a power cord connected to the terminal block. In certain embodiments, each current transformer signal information about current back to a larger system in communication with the power device.

Figure 3:
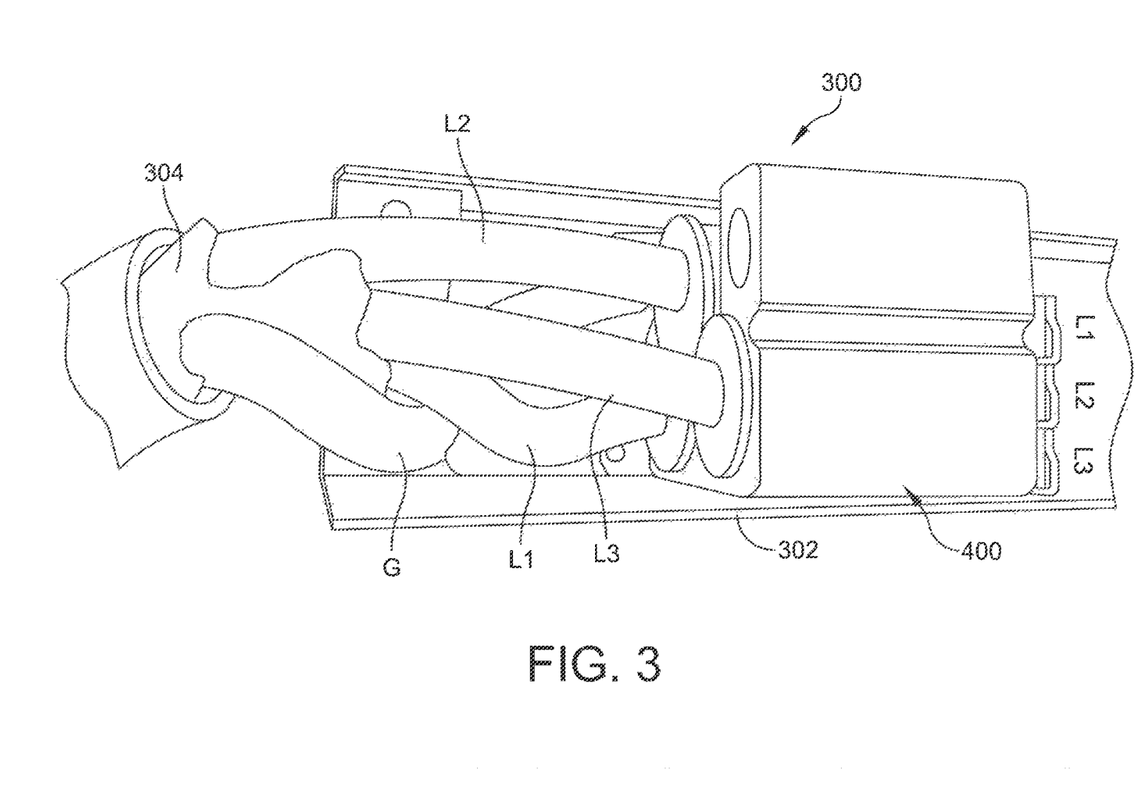
FIG. 3 is a partial perspective view of a power device having a terminal block with integrated current transformers of the present disclosure.

Referring to FIG. 3, a power device is generally indicated at 300. As shown, the power device 300 includes a generally box-shaped casing 302 and a power cord 304 that enters through one end of the casing. In one embodiment, the power device 300 may embody a rack powered distribution unit or a power strip, having a chassis or case that houses components of the device and a power cord. As shown, the power cord 304 enters the power device 300 through the end of the casing 302. However, the power cord 300 may be configured to enter through a side of the casing 302. In the shown embodiment, power cord 304 may be a 5-wire, 3-phase, 6AWG power cord in which the three primary lines are identified as L1, L2, and L3. However, other power configurations and wire gauges may be used. The two secondary lines, which are the ground and neutral lines, are identified as G and N, respectively. Other embodiments, the power cord 304 may support 3-wire, 1-phase; 4-wire, 3-phase; and 4-wire, bi-phase. The terminal block discussed herein can be modified to accommodate these different wiring configurations.

Figure 6:
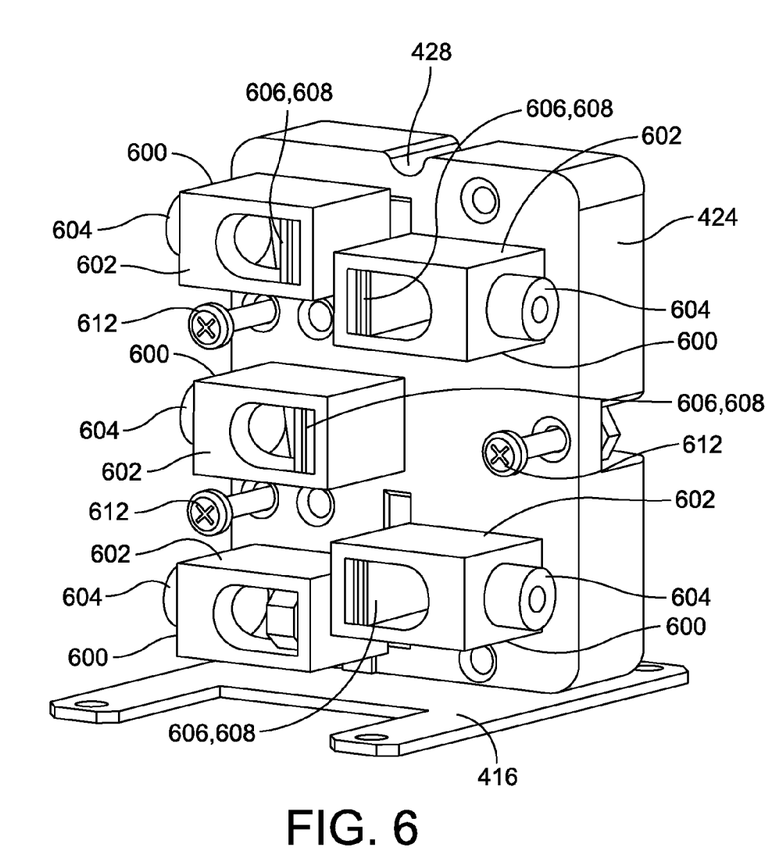
FIG. 6 is a front perspective view of the terminal block with a front portion removed to expose lugs of the terminal block.
Figure 7:
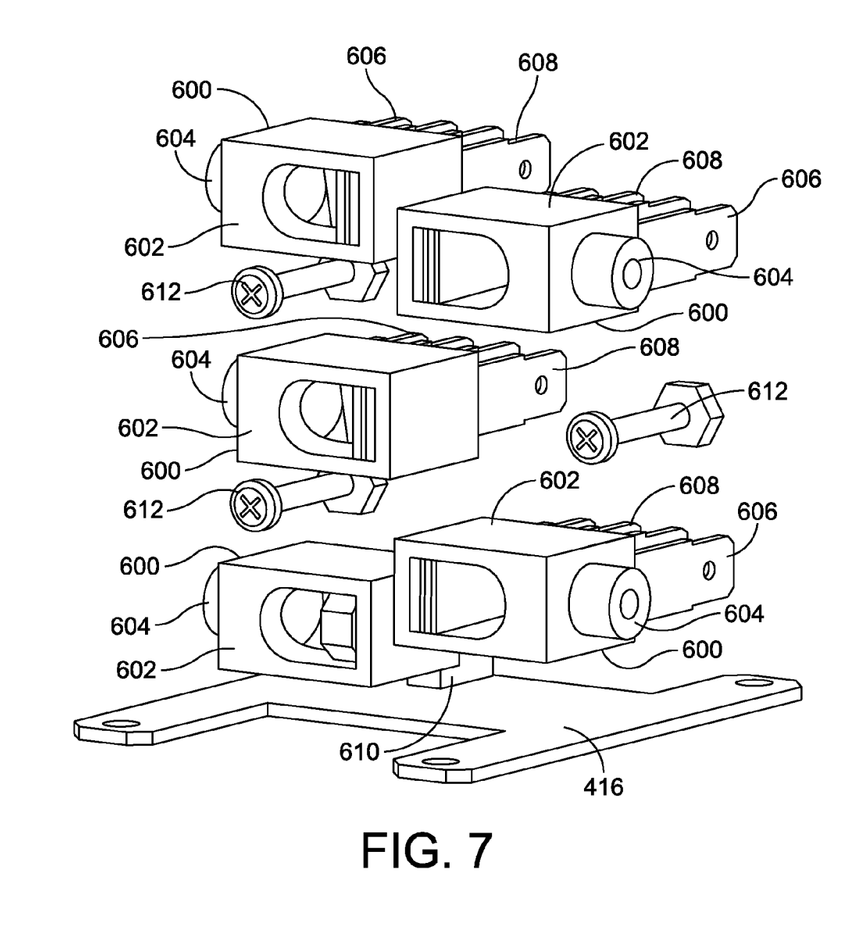
FIG. 7 is a front perspective view of the terminal block illustrating the metal/conductive components of the terminal block only.
Figure 8:
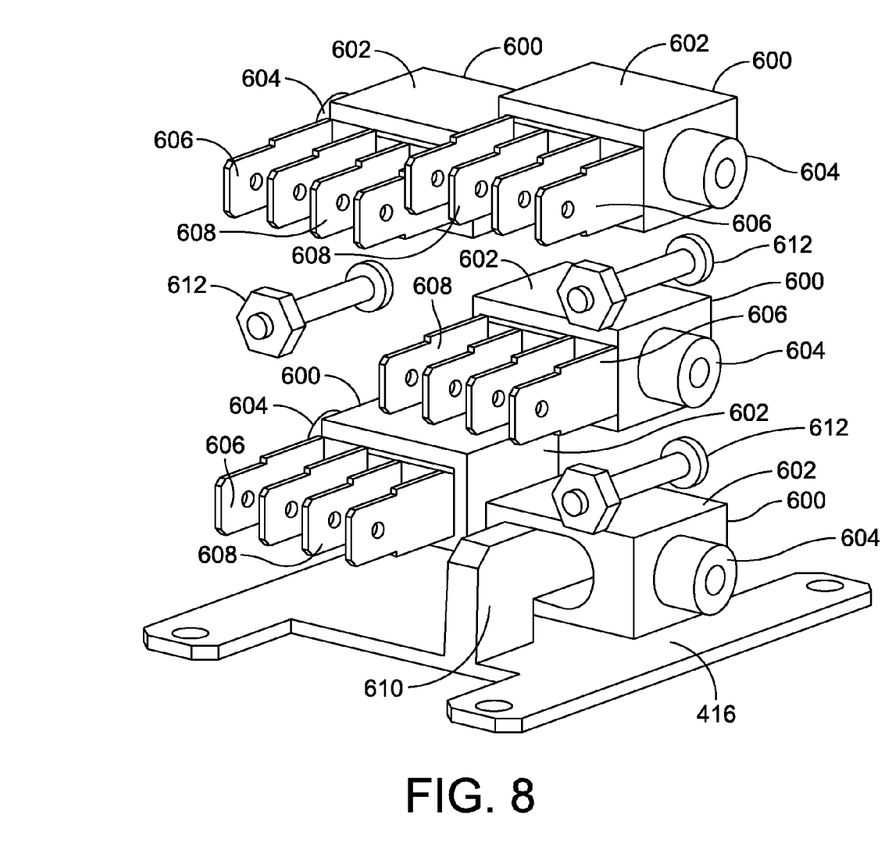
FIG. 8 is a rear perspective view of the terminal block shown in FIG. 7.

Referring to FIGS. 4-8, the power device 300 includes a terminal block, generally indicated at 400, to secure the power cord to the casing 302 of the power device. As shown, the terminal block 400 includes a body 402 that is sized and configured to fit within the casing 302 of the power device 300. The body 402 includes a front side 404, a back side 406, a left side 408, a right side 410, a top 412, and a bottom 414. As shown in FIG. 8, the terminal block 400 further includes a mounting plate 416 that is secured to the bottom 414 of the body 402. The mounting plate 416 includes four tabs, each indicated at 418, positioned at the corners of the bottom 414 of the body 402. Each tab 418 includes an opening 420 that is used to secure the terminal block 400 to the casing 302 of the power device 300 with an appropriate fastener. The mounting plate 416 may further act to conduct earth-ground from the power cord to the casing 302.

In one embodiment, the body 402 of the terminal block 400 may be of two-piece construction, having a front portion 422 that has the front side 404 and a back portion 424 that has the back side 406. The two-piece construction of the body 402 of the terminal block 400 may be easily seen in FIG. 6 in which the front portion 422 is removed to view the back portion 424. In one embodiment, the front portion 422 and the back portion 424 may be fabricated from dielectric material, such as hard plastic. However, any appropriate material may be provided to form the body of the terminal block.

Figure 5:
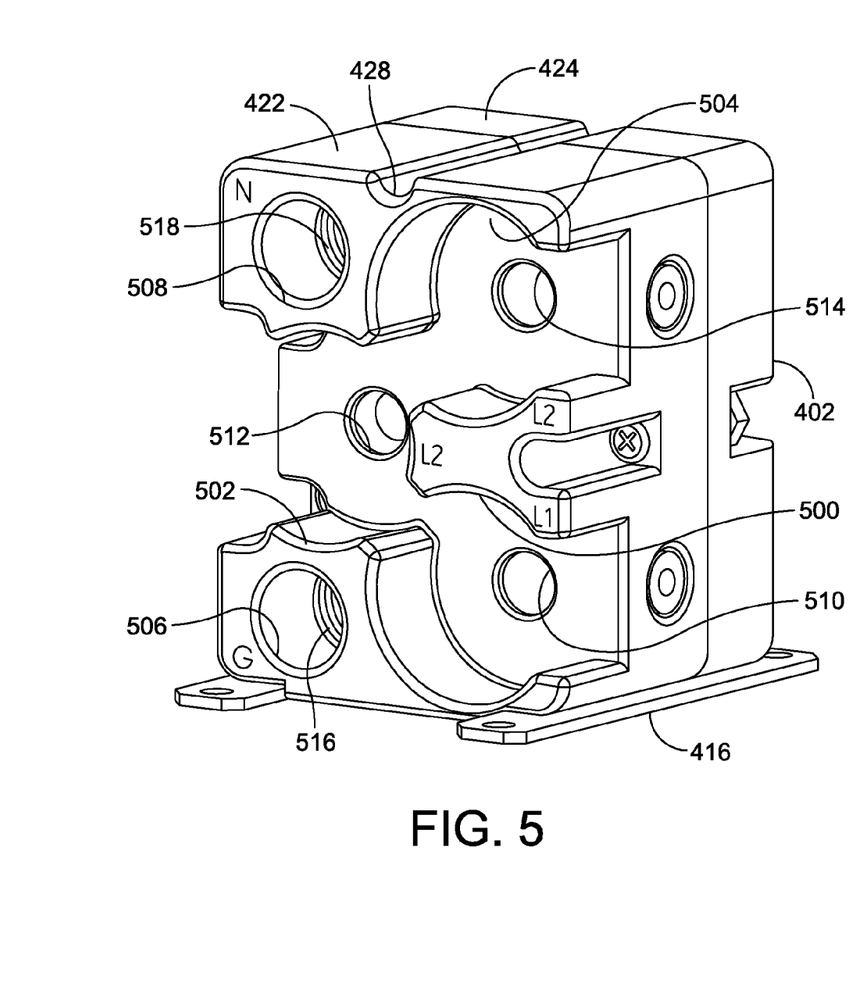
FIG. 5 is a front perspective view of the terminal block with the current transformers removed.

The front side 404 of the body 402 of the terminal block 400 includes five circular recesses formed therein, three larger recesses 500, 502, 504, and two smaller recesses 506, 508. As shown in FIG. 5, each large recess 500, 502, 504 communicate with a smaller opening 510, 512, 514, respectively, which is concentric with the recess. Similarly, each small recess 506, 508 communicates with an opening 516, 518, respectively, which are concentric with the recess. The arrangement is such that each recess and its corresponding opening extend axially through a width of the front portion 422 of the body 402 of the terminal block 400. The three larger recesses 500, 502, 504 (also indicated by L1, L2, and L3 in FIG. 5) are provided to receive the three primary lines (L1, L2, and L3) of the power cord 304 and the two smaller recesses 506, 508 (also indicated by G and N in FIG. 5) are provided to receive the ground and neutral lines G, N. In addition to or in lieu of the labels (L1, L2, L3, G), the use of color codes may be used to indicate the location of where to attach the wires of the power cord 304 to the terminal block 400.

Figure 4:
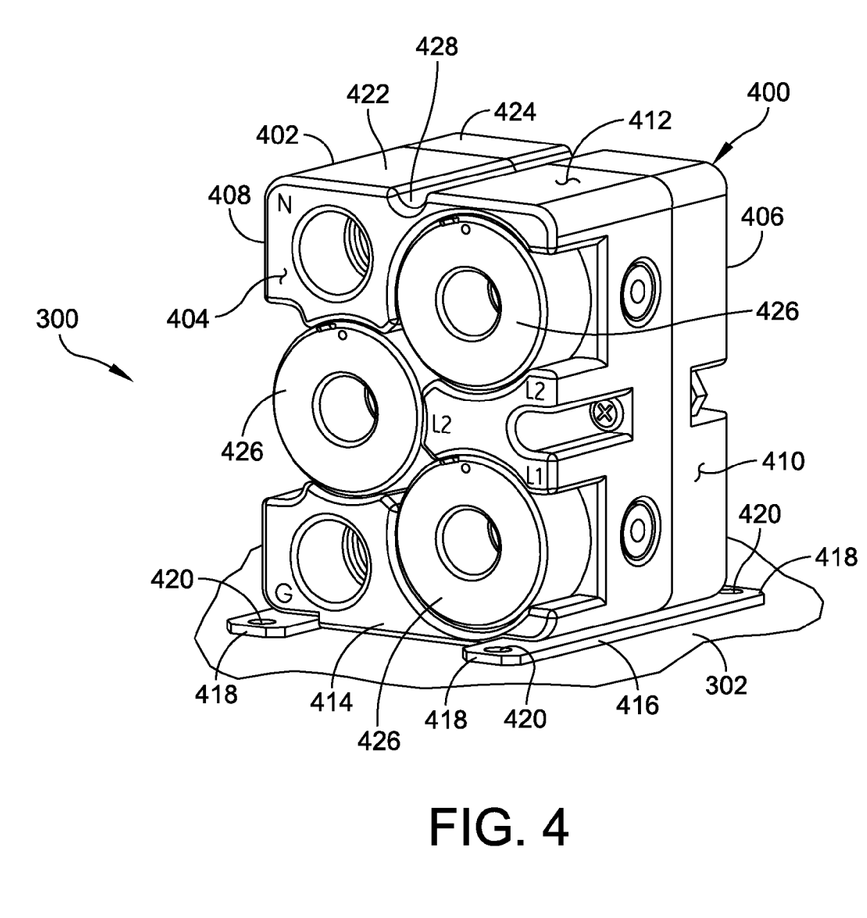
FIG. 4 is a front perspective view of the terminal block with integrated current transformers shown in FIG. 3.

As shown in FIG. 4, the larger recesses are each configured to receive therein an annular-shaped current transformer, each indicated at 426. As discussed above, the current transformers 426 measure current through the wires L1, L2, L3 of the power cord 304 secured to the terminal block 400. In certain embodiments, each current transformer 426 is configured to have a primary winding (the opening that supports a primary wire), a magnetic core, and a secondary winding that is connected to sensing circuitry. Alternating current flowing in the primary winding of the current transformer 426 produces a magnetic field in the core, which then induces a current in the secondary winding circuit. The current transformer 426 is designed to help ensure that the primary and secondary circuits are efficiently coupled, so that the secondary current bears an accurate relationship to the primary current. The current transformers 426 can be purchased from a transformer company, and then will be set into the terminal block 400 when manufacturing the power device 300. For example, a current transformer may be purchased from Falco Electronics of Miami, Fla., which may be customized to fit within recesses of the terminal block and to support the primary wire diameter, providing a desired current in to current out ratio. The diameters of the recesses further may be customized to receive a specific current transformer therein.

Referring now to FIGS. 6-8, the back portion 424 of the body 402 of the terminal block 400 includes five lugs, each indicated at 600 and configured to mechanically and electrically secure a wire (L1, L2, L3, G, N) of the power cord 304 to the terminal block. Each lug 600 includes a housing 602 and a set screw 604 secured to a side of the housing to secure the striped free end of the wire (L1, L2, L3, G, N) to the lug. The top four lugs 600, i.e., the lugs associated with N, L1, L2, and L3, each further include a folded long blade connector 606 and a folded short blade connector 608 both of which are secured to the housing 602 of the lug 600. In a certain embodiment, a common type of blade connector is a FASTON®, manufactured by The Whitaker LLC of Wilmington, Del. FASTON® connectors or tabs come in male and female types, and have been commonly used in the trade for many years. These types of blade connectors are commonly referred to as quick-connect terminal connectors. Other compression terminal connectors may be provided instead of FASTON® connectors. The bottom or fifth lug 600, i.e., the lug associated with G, also further includes a finger 610 that is part of the mounting plate 416 and provides a ground to the terminal block 400. Three fasteners, each indicated at 612, such as nut and bolt fasteners, are further provided to secure the front and back portions 422, 424 of the body 402 of the terminal block 400 together. In another embodiment, the front and back portions 422, 424 may be secured together by other suitable methods, such as by ultrasonic welding.

In the shown embodiment, the set-screws 604 for each of the five lugs 600 are sunk flush with the housing 602 of the lug 600. The lug 600 is set into a front surface of the housing 602, and then loosened to hold them in place during the assembly of the terminal block 400. The pattern of top four lugs 600 (lugs for N, L1, L2, and L3) is configured to support the load wires.

Figure 9:
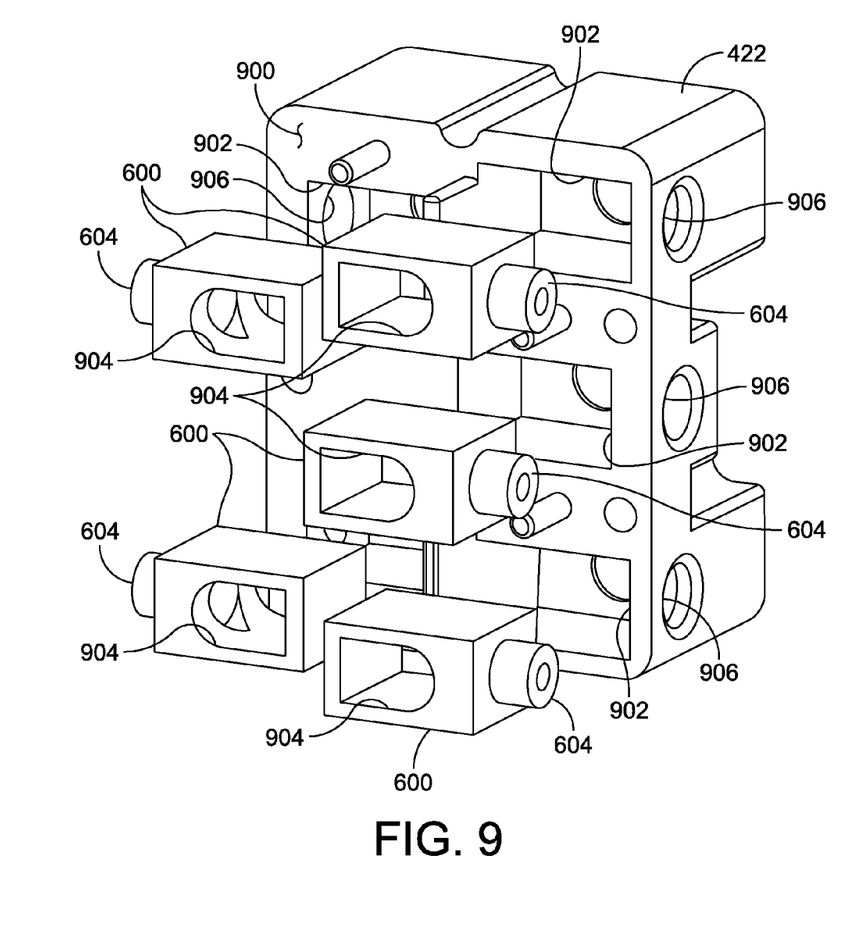
FIG. 9 is a rear perspective view of the terminal block illustrating the insertion of lugs to a body of the terminal block.

Referring to FIG. 9, the lugs 600 are secured to the terminal block 400 as follows. The front portion 422 has a back surface 900 that includes a plurality of recesses or pockets, each indicated at 902, formed therein. The arrangement is such that the lugs 600 are inserted into the respective recesses 902 so that the connectors 606, 608 extend through recesses 904 formed in each lug as shown in FIG. 6. The set screws 604 are accessible through openings 906 formed in the sides of the front portion to secure the wires of the power cord 304 when connecting the power cord to the terminal block 400.

Thus, as shown, the terminal block 400 is secured to the casing 302 of the power device 300 by fastening the mounting plate 416 to the casing. Once secured, the power cord 304 is secured to the terminal block 400 by securing wires of the power cord (L1, L2, L3, G, N) to their respective lugs 600 of the terminal block. Specifically, ends of the wires are inserted into respective openings 904 of the lugs and secured by the set screws 604. The set screws 604 mechanically and electrically secure the wires of the power cord 304 to their respective connectors 606, 608 and finger 610.

A method of measuring current within the power device 300, such as a rack powered distribution unit, is further disclosed herein. The method includes securing the terminal block 400 to the casing 302 of the power device 300. The method further includes inserting three current transformers 426 within the respective recesses 500, 502, 504 formed in the body 402 of the terminal block. Next, the three primary wires (L1, L2, and L3) of the power cord 304 are connected to respective lugs 600 of the terminal block with the wires of the power cord extending through their respective current transformers 426. The method further includes measuring the current of the three primary wires (L1, L2, and L3) of the power cord 304 with the current transformers 426.

In certain embodiments, the primary is an opening formed in a center of the current transformer, through which the main power conductor travels through on its way to a lug. The secondary is a bobbin of the wire wrapped toroidally, with the ends exposed as short black and red wires. These secondary wires travel up over the top of the terminal block through a groove to the sensing electronics of the device. That circuit is able to compute the current that is present on the primary of the transformer. In some embodiments, the neutral and ground currents are not monitored, only the line currents L1, L2, and L3. Thus, the provision of three current transformers and not five transformers may be included. However, current transformers may be provided for the neutral and ground lines of the power cord. Breaks in rims that are open along outermost surfaces of the body of the terminal block may be included to handle the required size of the current transformers, which are large enough to support the other specifications of the sensor.

As mentioned, in the disclosed embodiment, the top four lugs are similar in construction, and use all of the same parts, namely, a lug, a set-screw, a folded long FASTON® tab that exposes two tabs, and a folded short FASTON® tab that exposes two more tabs. Each of these four lugs is constructed to accept a large wire from the power cord. In the shown embodiment, the bottom lug does not support any of the FASTON® tabs. Instead, the bottom lug is connected to the finger that is part of the mounting plate. The mounting plate anchors the terminal block to the larger product and passes earth-ground to the larger product. Any of these five lugs have a power cord wire inserted therein, while the set-screw is loose. The set-screw is then tightened to compress the wire against the flat surface on the opposing side of the lug. For the top four lugs, the compression of the wire is against the FASTON® tabs. For the ground lug, the compression of the wire is against the grounded finger.

In certain embodiments, the current transformers may sit within the wells or recesses of the terminal block. The power cord wires may be run into the terminal block through the current transformers for three of the wires. The five wires may be fixed in place by the screw lugs on the sides of the terminal block.

In certain embodiments, the terminal block may be fastened to the enclosure of the product. This construction binds the earthing ground from the power cord to the product case.

In certain embodiments, the several loads supported by the terminal block may be attached by FASTON® tab terminated wires. The secondary signal wires from the current transformers may be routed over the top of the terminal block through the groove to attach to product elements on that side of the terminal block.

The terminal block of the present disclosure offers the following features: (1) embedding some quantity of current transformers within the entry side of a power cord supporting terminal block; (2) attaching the earthing ground of the power cord ground wire directly to the terminal block mounting bracket; and (3) providing a chase-way for the current transformer signal wires through the terminal block by a groove, such as groove on top.

In certain embodiments, the blade connector is a type of single wire connection using a flat conductive blade which is inserted into a blade receptacle. Usually both blade connector and blade receptacle have wires attached to them either through soldering of the wire to the blade or crimping of the blade to the wire. In some embodiments, the blade may be an integral manufactured part of a component, and a blade receptacle may be pushed onto the blade to form a connection. As mentioned, a common type of blade connector is the FASTON® tab.

Having thus described at least one illustrative embodiment of the disclosure, various alterations, modifications and improvements will readily occur to those skilled in the art. Such alterations, modifications and improvements are intended to be within the scope and spirit of the disclosure. Accordingly, the foregoing description is by way of example only and is not intended as limiting. The limit of the disclosure is defined only in the following claims and the equivalents thereto.

What is claimed is:

1. A terminal block for a power device including a casing and a power cord, the terminal block being configured to be secured within the casing and to secure the power cord, the terminal block comprising:
   a body configured to fit within the casing of the power device, the body having at least one recess formed therein, the body including a front portion and a back portion, the front portion and the back portion each being fabricated from dielectric material, the front portion of the body including a front surface having at least one recess formed therein, the back portion of the body including at least one lug corresponding to the at least one recess formed in the front portion of the body; and
   at least one current transformer sized to fit within the at least one recess of the body,
   wherein each lug is configured to secure an end of a wire of the power cord through a respective current transformer.

2. The terminal block of claim 1, wherein the front surface of the front portion of the body includes three recesses formed therein.

3. The terminal block of claim 2, wherein the back portion of the body includes three lugs corresponding to the three recesses formed in the front portion of the body.

4. The terminal block of claim 3, wherein each lug includes a housing, a set screw coupled to the housing and configured to secure a wire to the housing, a folded long tab coupled to the housing, and a folded short tab coupled to the housing.

5. The terminal block of claim 4, wherein the back portion includes at least one of a fourth lug and a fifth lug configured to receive a finger that is part of a mounting plate that secures the terminal block to the casing of the power device.

6. The terminal block of claim 5, wherein the fourth lug includes a housing, a set screw coupled to the housing and configured to secure a wire to the finger.

7. The terminal block of claim 2, wherein the body is rectangular in cross section.

8. The terminal block of claim 7, wherein the power device is a rack powered distribution unit.

9. The terminal block of claim 3, further comprising up to three current transformers sized to fit within respective recesses of the body.

10. The terminal block of claim 9, wherein each recess is circular in shape.

11. The terminal block of claim 4, wherein the front portion has a back surface that includes three pockets formed therein, each pocket being configured to receive a respective lug therein.

12. A method of measuring current within a power device, the method comprising:
   providing a terminal block configured to be secured within a casing of the power device and to secure a power cord of the power device;
   inserting at least one current transformer sized to fit within at least one recess provided in a body of the terminal block;
   connecting at least one wire of a power cord to a lug of the terminal block with the at least one wire extending through the at least one current transformer; and
   measuring current of the at least one wire of the power cord with the at least one current transformer.

13. The method of claim 12, wherein a front portion of the body of the terminal block includes a front surface having three recesses formed therein.

14. The method of claim 13, wherein a back portion of the body of the terminal block includes three lugs corresponding to the three recesses formed in the front portion of the body, and wherein the method further comprises inserting three current transformers into respective recesses of the body.

15. The method of claim 14, wherein each lug is configured to secure an end of a wire of the power cord.

16. The method of claim 15, wherein each lug includes a housing, a set screw coupled to the housing and configured to secure a wire to the housing, a folded long tab coupled to the housing, and a folded short tab coupled to the housing.

17. The method of claim 16, wherein the back portion includes a fourth lug configured to receive a finger that is part of a mounting plate that secures the terminal block to the casing of the power device.

18. The method of claim 17, wherein the fourth lug includes a housing, a set screw coupled to the housing and configured to secure a wire to the finger.

* * * * *